United States Patent

Ghosh et al.

[11] Patent Number: 5,712,322
[45] Date of Patent: Jan. 27, 1998

[54] COMPOSITIONS OF MATTER

[75] Inventors: Pushpito Kumar Ghosh, New Bombay, India; Iain Andrew Weddell, Culcheth; John Edward Yates, Rochdale, both of United Kingdom

[73] Assignee: Zeneca Limited, London, United Kingdom

[21] Appl. No.: 530,356

[22] PCT Filed: Apr. 6, 1994

[86] PCT No.: PCT/GB94/00730

§ 371 Date: Dec. 12, 1995

§ 102(e) Date: Dec. 12, 1995

[87] PCT Pub. No.: WO94/24170

PCT Pub. Date: Oct. 27, 1994

[30] Foreign Application Priority Data

Apr. 8, 1993 [GB] United Kingdom ............ 9307479

[51] Int. Cl.$^6$ .................................... C08F 265/10
[52] U.S. Cl. ........................ 522/69; 522/8; 522/10; 522/48; 522/68; 502/106
[58] Field of Search ................... 522/8, 10, 48, 522/68, 69; 502/167

[56] References Cited

U.S. PATENT DOCUMENTS

| | | | |
|---|---|---|---|
| 2,989,455 | 6/1961 | Neugebauer | 204/158 |
| 4,828,583 | 5/1989 | Oxman et al. | 51/295 |
| 5,283,160 | 2/1994 | Allen et al. | 430/281 |
| 5,321,053 | 6/1994 | Hino et al. | 522/26 |
| 5,545,676 | 8/1996 | Palazzotto et al. | 522/15 |

FOREIGN PATENT DOCUMENTS 336 417  10/1989  European Pat. Off. .......... C08F 2/50

*Primary Examiner*—George F. Lesmes
*Assistant Examiner*—Steven H. VerSteeg
*Attorney, Agent, or Firm*—Victoria M. Malia

[57] ABSTRACT

A composition of matter useful in the production of photoinitiator compositions, said compositions of matter comprising 100 parts by weight of camphorquinone and from 1 to 50 parts by weight of an anthraquinone compound having in the 2-position a substituent of the formula:

$$-X-COR^1 \qquad (1)$$

wherein $R^1$ represents an optionally substituted hydrocarbyl radical and X represents $$-O-, -S- \text{ or } -N- \atop R^2$$

wherein $R^2$ represents hydrogen or an optionally substituted hydrocarbyl radical.

10 Claims, 3 Drawing Sheets

COMPOSITIONS OF MATTER

This application claims benefit of international application PCT/GB94/00730, filed Apr. 16, 1994.

This invention relates to compositions of matter, to photoinitiator compositions and photopolymerisable compositions derived therefrom and to their use in the production of polymeric materials.

It is known to polymerise olefinically unsaturated compounds by exposing such compounds to electromagnetic radiation such as visible or ultraviolet light in the presence of a photoinitiator which is capable of absorbing the radiation and thereby generating free radicals.

One known class of photoinitiators comprises ketones which are generally used in conjunction with a hydrogen donor such as an amine from which the photoinitiator, when subjected to and excited by radiation of appropriate wavelength, abstracts a hydrogen atom and so forms radicals. Certain ketone photoinitiators are described in United Kingdom Patent No 1408265, particular emphasis being placed on α-diketones one of which, camphorquinone, has achieved considerable commercial success as a component of visible light curable compositions in spite of its high cost and sensitivity to oxygen inhibition.

It has now been found that the disadvantages associated with camphorquinone can be minimised by using it in conjunction with certain anthraquinone compounds as hereinafter defined. In particular, it has been found that when the hereinafter defined combinations of camphorquinone and an anthraquinone compound are used, a satisfactory cure rate can be maintained at lower levels of camphorquinone, thus reducing costs, and also that the sensitivity to inhibition by oxygen is reduced.

Accordingly, in one aspect, the invention provides a composition of matter comprising 100 parts by weight of camphorquinone and from 1 to 50 parts by weight of an anthraquinone compound having in the 2-position a substituent of the formula:

$$-X-COR^1 \qquad (1)$$

wherein $R^1$ represents an optionally substituted hydrocarbyl radical and X represents

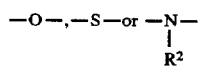

$$-O-, -S- \text{ or } -N-$$
$$\qquad\qquad\qquad |$$
$$\qquad\qquad\qquad R^2$$

wherein $R^2$ represents hydrogen or an optionally substituted hydrocarbyl radical.

Optionally substituted hydrocarbyl radicals which may be represented by $R^1$ and $R^2$ in the anthraquinone compound include optionally substituted alkyl, optionally substituted aryl and optionally substituted alkenyl.

Substituents which may optionally be present on the hydrocarbyl radicals include halogen atoms such as chlorine. As examples of optionally substituted alkyl radicals which may be represented by $R^1$ and $R^2$, there may be mentioned optionally substituted $C_{1-4}$-alkyl, for example methyl, chloroethyl and isobutyl, and also optionally substituted higher alkyl radicals which may be linear or branched and which may contain up to 10 carbon atoms, for example hexyl and 2-ethylpentyl, or even larger numbers of carbon atoms, for example up to 20. As examples of optionally substituted aryl radicals which may be represented by $R^1$ and $R^2$, there may be mentioned optionally substituted phenyl and, as examples of optionally substituted alkenyl radicals, there may be mentioned optionally substituted vinyl and also optionally substituted higher alkenyl radicals containing up to 20 carbon atoms, for example heptadecenyl. The presence, as $R^1$ or $R^2$, of alkyl or alkenyl radicals having more than 4 carbon atoms can provide the anthraquinone compound with increased solubility in the polymerisable olefinically unsaturated compound and therefore permit higher concentrations of photoinitiator to be present in compositions of the invention. The positions of the anthraquinone nucleus other than the 2-position may be unsubstituted or substituted.

As an example of a preferred anthraquinone compound there may be mentioned 2-acryloylaminoanthraquinone.

If desired, the compositions of the invention may contain a mixture of two or more of the 2-substituted anthraquinones.

Preferred compositions of the invention contain from 2 to 25 parts by weight of the anthraquinone compound for each 100 parts by weight of camphorquinone and particularly include compositions in which the anthraquinone compound and the camphorquinone are present in a molar ratio of approximately 1 to 10.

The compositions of matter as defined above may be used in conjunction with conventional hydrogen donors in the preparation of photoinitiator compositions.

Accordingly, in a second aspect, the invention provides a photoinitiator composition comprising:

(a) a photoinitiator comprising 100 parts by weight of camphorquinone and from 1 to 50 parts by weight of an anthraquinone compound as hereinbefore defined, and (b) a hydrogen donor capable of reducing the photoinitiator when the latter is in an excited state.

Hydrogen donors which may be present in the photoinitiator composition include primary, secondary or tertiary amines in which at least one hydrogen atom is directly attached to a saturated carbon atom adjacent to the amino nitrogen. Suitable amines are well known in the art and include, for example, propylamine, diethylamine, triethylamine, benzyldimethylamine, N-phenylglycine, N, N-dimethylethanolamine, N-methyldiethanolamine, triethanolamine and, especially, dimethylaminoethyl methacrylate or ethyl p-dimethlyaminobenzoate. Mixtures of hydrogen donors, for example mixtures of amines, may be used.

In preferred photoinitiator compositions, the ratios of anthraquinone compound to camphorquinone may correspond to those given above for preferred compositions of the invention.

The photoinitiator compositions described above may be used in conjunction with polymerisable olefinic compounds in the preparation of photopolymerisable compositions, including visible light curable compositions.

Accordingly, in a third aspect, the invention provides a photopolymerisable composition comprising a polymerisable olefinically unsaturated compound and a photoinitiator composition as hereinbefore defined.

Figure 1:
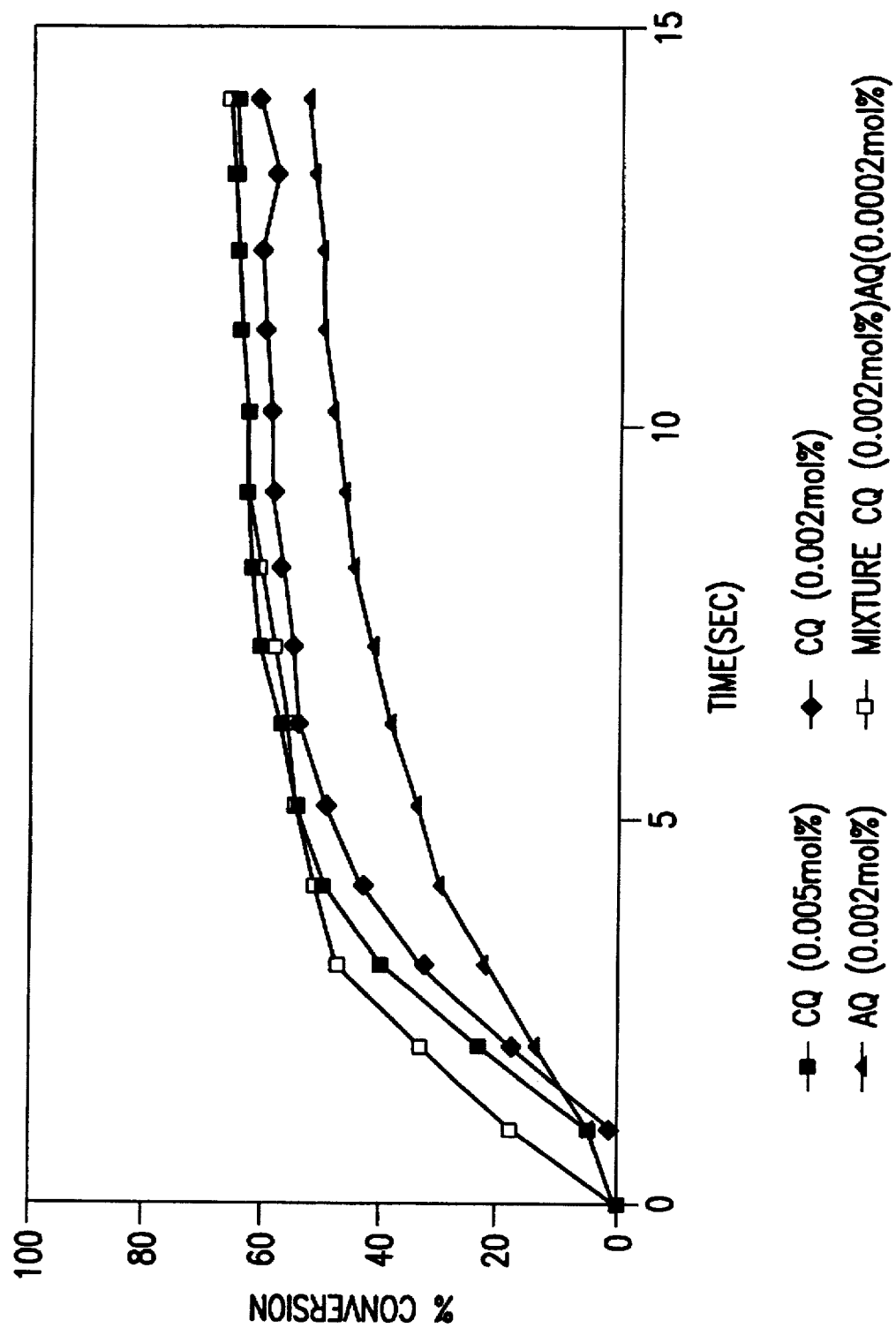
FIG. 1 depicts percent conversion of polymerizable groups versus time for vinyl urethane resins containing triethylene glycol dimethacrylate and one of the following photoinitiatior compositions: a) 0.005 mol % camphorquinone (CG), b) 0.002 mol % CQ, c) 0.0002 mol % 2-(2-ethylhexanoylamino) anthraquinone (AQ), and d) a mixture of 0.002 mol % CQ and 0.0002 mol % AQ. Each composition also contains ethyl-p-dimethylaminobenzoate in an amount equal to that of the photoinitiator used.

The polymerisable olefinically unsaturated compound present in the photopolymerisable composition of the invention will generally be a monomer, oligomer or polymer having at least one olefinically unsaturated double bond per molecule. Mixtures of two or more such compounds may be used if desired, for example a mixture comprising one or more monofunctional polymerisable compound and one or more polyfunctional polymerisable compound.

Suitable polymerisable olefinic monomers have been fully described in the prior art and include, for example, alpha-beta-unsaturated carboxylic acids, for example acrylic and methacrylic acids and the corresponding nitriles, amides and esters, for example acrylonitrile, ethyl acrylate, methyl methacrylate, butyl methacrylate, glycidyl methacrylate, triethylene glycol dimethacrylate, ethoxylated bisphenol A dimethacrylate, acrylamide and methylene bis-acrylamide, vinyl aromatic compounds, for example styrene, alpha-methylstyrene and vinyltoluene, dienes, for example butadiene and isoprene, vinyl chloride, vinylidene chloride, vinyl carbazole, vinyl ketones, vinyl urethanes and vinyl esters, for example vinyl acetate. Oligomers derived from these monomers may also be used. Olefinically unsaturated polymers which may be present in the compositions of the invention include unsaturated polyesters derived, for example, from unsaturated dicarboxylic acids.

The camphorquinone/anthraquinone compound combination is suitably present in the photopolymerisable compositions of the invention in an amount of from 0.01 to 5%, preferably from 0.05 to 2%, on a weight basis. The hydrogen donor may be present in an amount of from 0.01 to 5%, preferably from 0.5 to 1%, on a weight basis.

The photopolymerisable compositions of the invention may be prepared by incorporating the photoinitiator composition or each of the separate components thereof into the polymerisable olefinically unsaturated compound or compounds in any convenient manner. Other conventional additives may also be incorporated if desired, for example peroxides such as benzoyl peroxide, peroxyesters such as tert-butyl perbenzoate, colouring agents, plasticisers, fillers, thermal polymerisation inhibitors and the like.

Photopolymerisation of the photopolymerisable compositions of the invention may be effected by subjecting said compositions, preferably in the form of films, to radiation from sources which have emission maxima in the range from 200 to 500 nm and especially in the range 400 to 500 nm. Suitable radiation sources are known in the art and include actinic or superactinic fluorescent tubes, low pressure, medium pressure and high pressure mercury vapour lamps and xenon lamps as well as tungsten halogen and blue phosphor-fluorescent lamps.

Thus, according to a further aspect of the invention, there is provided a method for the preparation of a polymeric material which comprises irradiating a photopolymerisable composition of the invention with radiation having a wavelength which is capable of being absorbed by the photoinitiator so as to convert it to an excited state.

The compositions of the invention are useful in the production of light-curable adhesives, coatings, inks and the like.

The invention is illustrated but not limited by the following Examples.

EXAMPLE 1

Four photopolymerisable compositions were prepared by incorporating photoinitiators into a vinyl urethane resin containing triethylene glycol dimethacrylate. The photoinitiators incorporated were:

a) 0.005 mol % camphorquinone (CQ), b) 0.002 mol % CQ, c) 0.0002 mol % 2-(2-ethylhexanoylamino) anthraquinone (AQ)

d) a mixture of 0.002 mol % CQ and 0.0002 mol % AQ

Ethyl p-dimethylaminobenzoate was included in each composition at a concentration equal to that of the photoinitiator.

The compositions were exposed to visible light and the rate of disappearance of the unsaturated groups was determined using real-time infra-red spectroscopy (wave number 1638 $cm^{-1}$). The corresponding rate of conversion of the polymerisable groups is shown in FIG. 1 of the accompanying drawings. It can be seen that incorporation of the anthraquinone compound permits the level of camphorquinone to be reduced from 0.005 to 0.002 mol % whilst preserving the rate of conversion.

EXAMPLE 2

The procedure described in Example 1 was repeated except that lauryl acrylate was used as the photopolymerisable material and the photoinitiators were:

a) 0.001 mol % CQ b) 0.0001 mol % 2-acryloylaminoanthraquinone (AA), c) a mixture of 0.001 mol % CQ and 0.0001 mol % AA.

Figure 2:
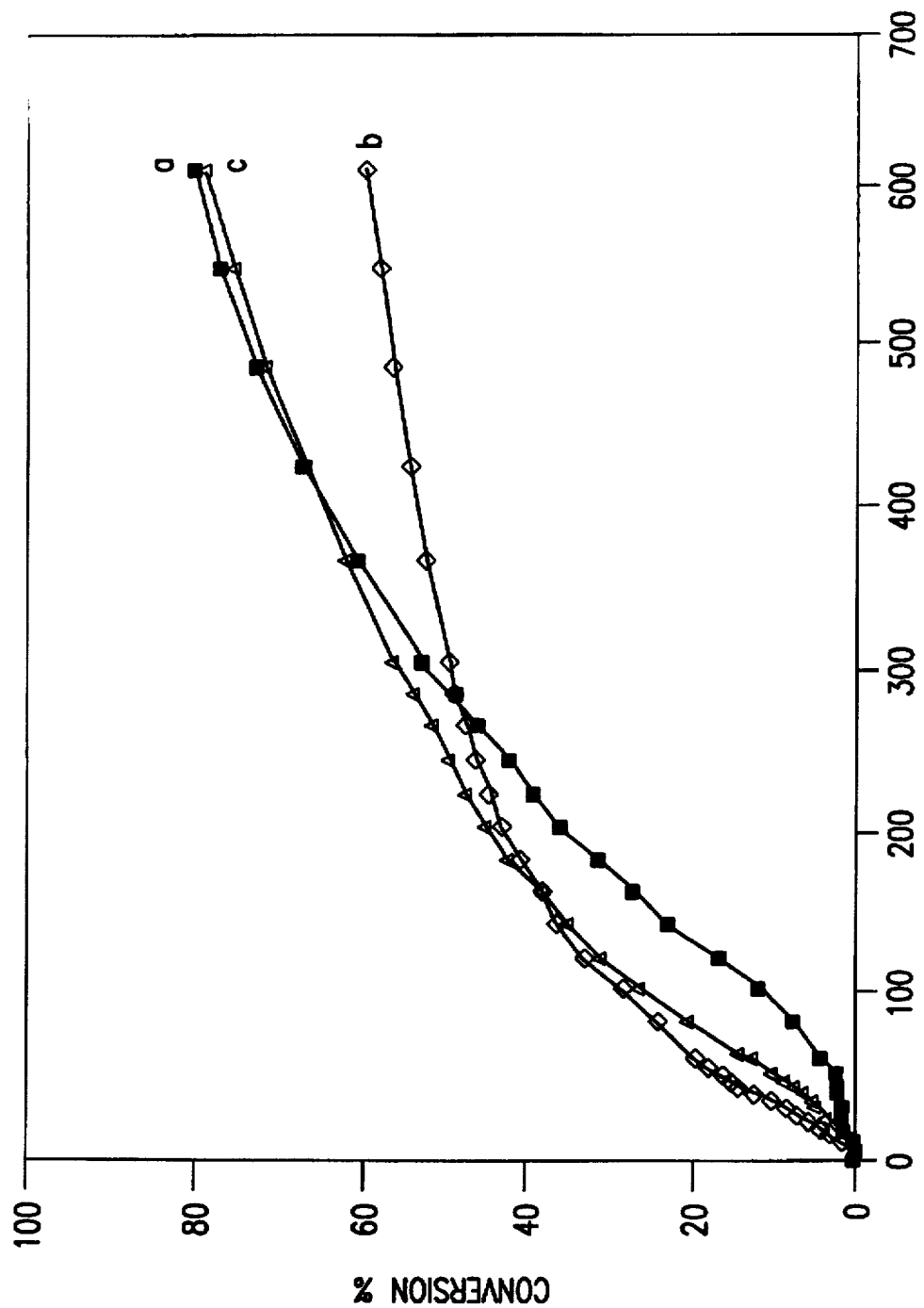
FIG. 2 depicts percent conversion of polymerizable groups versus time for lauryl acrylate resins containing one of the following photoinitiator compositions: a) 0.001 mol % CQ, b) 0.0001 mol % 2-acryloylaminoanthraquinone (AA), and c) a mixture of 0.001 mol % CQ and 0.0001 mol % AA. Each composition also contains ethyl-p-dimethylaminobenzoate in an amount equal to that of the photoinitiator used.

The rate of conversion of polymerisable groups is shown in FIG. 2 of the accompanying drawings from which it can be seen that camphorquinone suffers some initial inhibition but eventually overtakes the anthraquinone compound. The use of the mixture of camphorquinone and the anthraquinone compound reduces inhibition whilst maintaining the high conversion rate.

Figure 3:
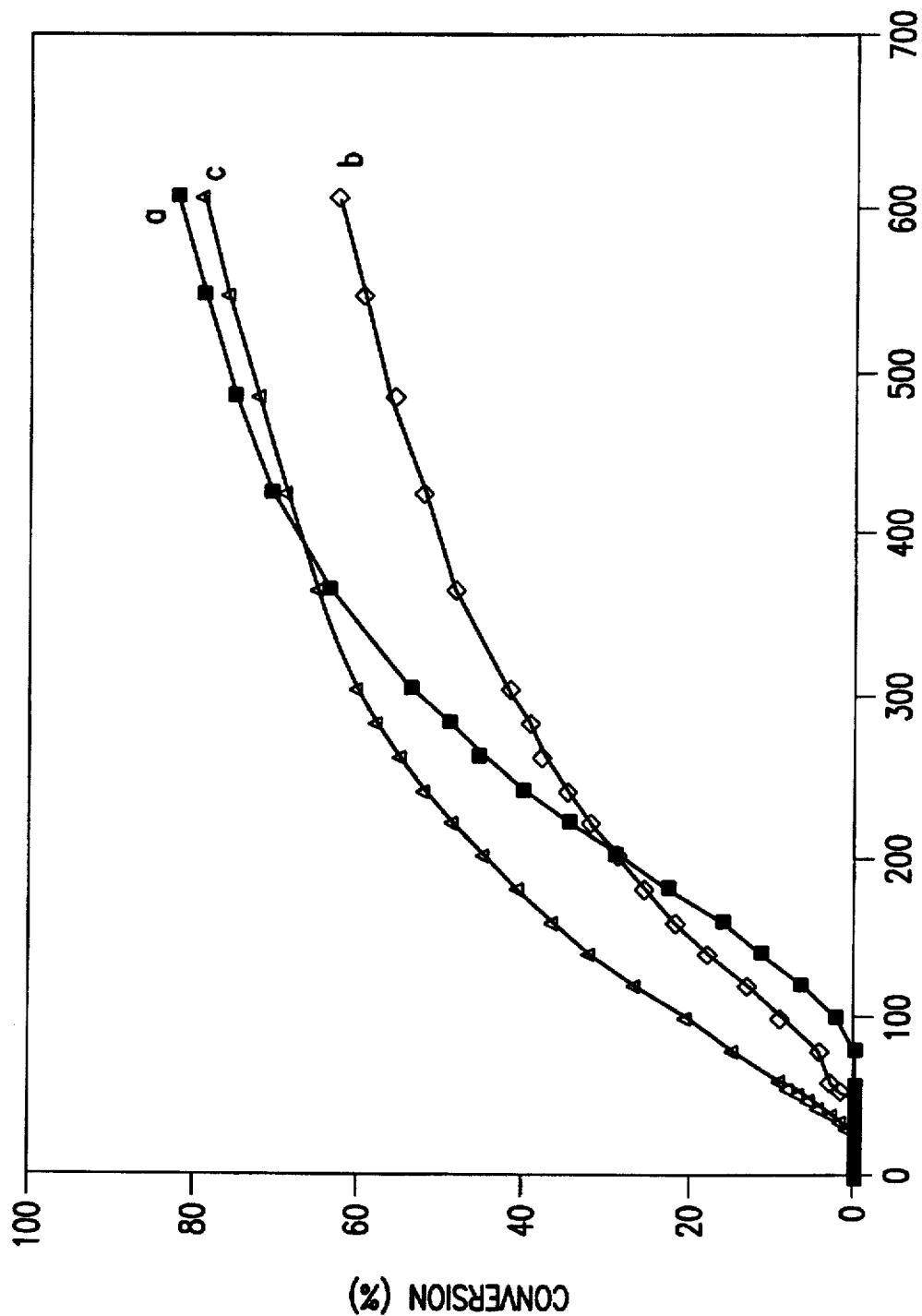
FIG. 3 is similar to FIG. 2, but lauryl acrylate is used that had been aerated by bubbling air through it for one hour.

This procedure was repeated using lauryl acrylate that had been aerated by bubbling air through it for one hour. The rate of conversion of polymerisable groups is shown in FIG. 3 of the accompanying drawings. It can be seen that the induction period for the camphorquinone system is approximately twice that for the sample containing the mixture of camphorquinone and the anthraquinone compound. In fact, the mixed initiator system is shown to be more resistant to oxygen inhibition than either of the systems based on camphorquinone alone or anthraquinone compound alone.

EXAMPLE 3

The procedure described in Example 1 was repeated using a photoinitiator comprising a mixture of 0.001 mol % CQ and 0.0001 mol % 2-(trimethylacetylamino) anthraquinone.

The polymerisation rate was similar to that observed in Example 1.

EXAMPLE 4

The procedure described in Example 1 was repeated using a photoinitiator comprising a mixture of 0.002 mol % CQ and 0.0002 mol % 2-(2,2-dimethyloctanoylamino) anthraquinone.

The polymerisation rate was similar to that observed in Example 1.

We claim:

1. A composition of matter comprising 100 parts by weight of camphorquinone and from 1 to 50 parts by weight of an anthraquinone compound having in the 2-position a substituent of the formula:

—X—COR¹  (1)

wherein R¹ represents an optionally substituted hydrocarbyl radical and X represents —O—, —S— or —N—
            |
            R² wherein R² represents hydrogen or an optionally substituted hydrocarbyl radical.

2. A composition according to claim 1 wherein R¹ is an optionally substituted alkyl, aryl or alkenyl radical.

3. A composition according to claim 2 wherein R¹ is an optionally substituted alkyl or alkenyl radical containing up to 20 carbon atoms.

4. A composition according to claim 3 wherein the anthraquinone compound is 2-acryloylaminoanthraquinone.

5. A composition according to any one of claims 1 to 4 containing from 2 to 25 parts by weight of the anthraquinone compound for each 100 parts by weight of camphorquinone.

6. A photoinitiator composition comprising:

(a) a photoinitiator comprising a composition of matter as defined in claim 1, and (b) a hydrogen donor capable of reducing the photoinitiator when the latter is in an excited state.

7. A photoinitiator composition according to claim 6 wherein the hydrogen donor is a primary, secondary or tertiary amine in which at least one hydrogen atom is directly attached to a saturated carbon atom adjacent to the amino nitrogen.

8. A photopolymerisable composition comprising a polymerisable olefinically unsaturated compound and a photoinitiator composition as defined in claim 6 or claim 7.

9. A method for the preparation of a polymeric material which comprises irradiating a photopolymerisable composition as defined in claim 8 with radiation having a wavelength which is capable of being absorbed by the photoinitiator so as to convert it to an excited state.

10. A method according to claim 9 wherein the applied radiation comprises visible light.

* * * * *